(12) United States Patent
Maling et al.

(10) Patent No.: US 9,455,214 B2
(45) Date of Patent: Sep. 27, 2016

(54) WAFER FRONTSIDE-BACKSIDE THROUGH SILICON VIA

(71) Applicant: INTERNATIONAL BUSINESS MACHINES CORPORATION, Armonk, NY (US)

(72) Inventors: Jeffrey C. Maling, Grand Isle, VT (US); Anthony K. Stamper, Williston, VT (US); Zeljka Topic-Beganovic, Essex Junction, VT (US); Daniel S. Vanslette, Fairfax, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/281,210

(22) Filed: May 19, 2014

(65) Prior Publication Data

US 2015/0332966 A1    Nov. 19, 2015

(51) Int. Cl.
| | | |
|---|---|---|
| *H01L 21/44* | (2006.01) | |
| *H01L 23/48* | (2006.01) | |
| *H01L 21/768* | (2006.01) | |

(52) U.S. Cl.
CPC ....... *H01L 23/481* (2013.01); *H01L 21/76898* (2013.01); *H01L 23/48* (2013.01); *H01L 2224/11* (2013.01)

(58) Field of Classification Search
CPC .......... H01L 21/76898; H01L 23/481; H01L 2924/01078; H01L 2924/01079
USPC .................. 438/637, 638, 667, 675; 257/774
See application file for complete search history.

(56) References Cited

U.S. PATENT DOCUMENTS

| | | | |
|---|---|---|---|
| 7,749,899 B2 * | 7/2010 | Clark et al. .................... | 438/667 |
| 7,829,462 B2 | 11/2010 | DeNatale et al. | |
| 8,106,518 B2 | 1/2012 | Kawashita et al. | |
| 8,338,957 B2 | 12/2012 | Nilsson | |
| 8,466,060 B2 | 6/2013 | Feng | |
| 8,637,380 B2 * | 1/2014 | Sakata et al. ................. | 438/458 |
| 2008/0006850 A1 * | 1/2008 | Ribnicek ........... | H01L 21/76898 257/213 |
| 2008/0284041 A1 | 11/2008 | Jang et al. | |
| 2010/0072627 A1 * | 3/2010 | Wang ............................ | 257/774 |
| 2012/0061794 A1 | 3/2012 | Sadaka | |
| 2012/0168206 A1 | 7/2012 | Sekine et al. | |

FOREIGN PATENT DOCUMENTS

EP    2165362 B1    2/2012

OTHER PUBLICATIONS

Van Olmen, J. et al., "3D Stacked IC Demonstration Using a Through Silicon Via First Approach", Electron Devices Meeting, IEDM 2008, 4 pages.
Wang, T. et al., "Design and Realize of 3D Integration of a Pressure Sensor System With Through Silicon Via (TSV) Approach", 12th International Conference on Electronic Packaging Technology and High Density Packaging (ICEPT-HDP), IEEE, 2011, pp. 40-43.
Choi, W.C. et al., "Development of a 3-D Process Technology for Wafer-Level Packaging of MEMS Devices", IEEE Transactions on Components, Packaging and Manufacturing Technology, vol. 2, No. 9, Sep. 2012, pp. 1442-1448.

* cited by examiner

*Primary Examiner* — Quoc Hoang
(74) *Attorney, Agent, or Firm* — David Cain; Andrew M. Calderon; Roberts Mlotkowski Safran Cole & Calderon, P.C.

(57) ABSTRACT

A wafer frontside-backside through silicon via and methods of manufacture are disclosed. The method includes forming a plurality of frontside metalized vias into a partial depth of a substrate. The method further includes forming a backside via in the substrate which exposes, from the backside, the plurality of frontside metalized vias. The method further includes forming a metal in the via in contact with the plurality of metalized frontside vias.

20 Claims, 4 Drawing Sheets

WAFER FRONTSIDE-BACKSIDE THROUGH SILICON VIA

FIELD OF THE INVENTION

The invention relates to semiconductor structures and, more particularly, to a wafer frontside-backside through silicon via and methods of manufacture.

BACKGROUND

In electronic circuits, a through-silicon via (TSV) is a vertical electrical connection (via) passing completely through a silicon wafer or die. TSVs are a high performance technique used to create 3D packages and 3D integrated circuits. The density of the vias is substantially higher, and the length of the connections is shorter than conventional package to package connections using wirebond techniques.

TSVs are formed by etching completely through the silicon wafer. This is done through frontside etching processing. However, as the wafer is fragile, such processes lead to wafer breakage and also to variable depth TSV, which results in backside grind TSV reveal or overpolish problems.

SUMMARY

In an aspect of the invention, a method comprises forming a plurality of frontside metalized vias into a partial depth of a substrate. The method further comprises forming a backside via in the substrate which exposes, from the backside, the plurality of frontside metalized vias. The method further comprises forming a metal in the backside via in contact with the plurality of metalized frontside vias.

In an aspect of the invention, a method comprises forming a plurality of vias partially into a substrate, from a frontside. The method further comprises filling the plurality of vias with a metal. The method further comprises grinding a backside of the substrate. The method further comprises forming a via into the substrate, from a backside of the substrate, to expose the plurality of vias. The method further comprises metalizing the via to be in direct electrical contact with the plurality of vias.

In an aspect of the invention, a structure comprises: a substrate; a plurality of frontside metalized vias partially in a depth of the substrate; and a metalized backside via in the substrate, in direct electrical contact with the plurality of vias.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of the wafer frontside-backside through silicon via (TSV), which comprises the structures of the present invention. In still further embodiments, a method in a computer-aided design system is provided for generating a functional design model of the wafer frontside-backside TSV. The method comprises generating a functional representation of the structural elements of the wafer frontside-backside TSV.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor structures and, more particularly, to a wafer frontside-backside through silicon via (TSV) and methods of manufacture. More specifically, the present invention includes a via structure provided from both the frontside and backside of a wafer, using a plurality of metalized via structures. Advantageously, the present invention avoids TSV reveal and wafer breakage problems.

In more specific embodiments, the method of forming the structure of the present invention comprises first forming a plurality of frontside vias into a partial depth of a substrate. After the frontside vias and other devices are metalized followed by an optional wafer backside thinning step, in one embodiment, using backside grind, a backside TSV is formed in the substrate. The TSV is metalized and contacts the plurality of metalized frontside vias. In this way, a single via does not extend from the frontside to the backside of the substrate, which can otherwise cause breakage and other issues.

The wafer frontside-backside TSV of the present invention can be manufactured in a number of ways using a number of different tools. In general, though, the methodologies and tools are used to form structures with dimensions in the micrometer and nanometer scale. The methodologies, i.e., technologies, employed to manufacture the wafer frontside-backside TSV of the present invention have been adopted from integrated circuit (IC) technology. For example, the structures of the present invention are built on wafers and are realized in films of material patterned by photolithographic processes on the top of a wafer. In particular, the fabrication of the wafer frontside-backside TSV of the present invention uses three basic building blocks: (i) deposition of thin films of material on a substrate, (ii) applying a patterned mask on top of the films by photolithographic imaging, and (iii) etching the films selectively to the mask.

Figure 1:
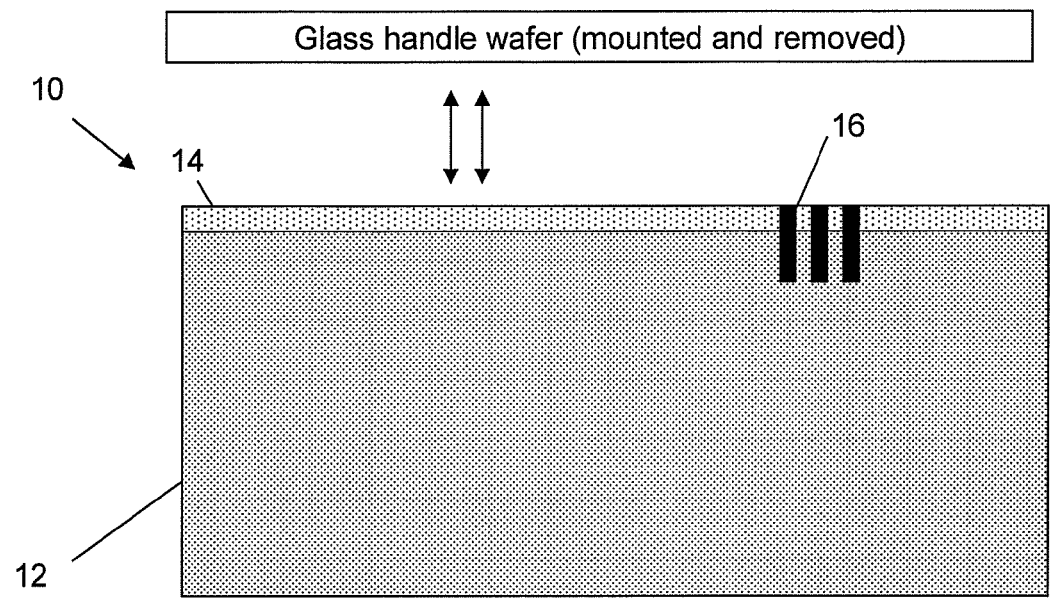
FIGS. 1-4 show several structures and respective processing steps in accordance with aspects of the present invention, with FIGS. 3a and 3b showing alternative structures and processing steps.

FIG. 1 shows a structure and respective processing steps in accordance with aspects of the present invention. More specifically, the structure 10 of FIG. 1 includes an insulator layer 14 formed on a substrate 12. One of skill in the art would understand that the insulator layer 14 can be one or more layers, which can include structures such as, for example, active and passive devices. In embodiments, the insulator layer 14 can be, for example, a silicon oxide based material. The insulator layer 14 can be formed on the substrate 12 using any known deposition or bonding process. For example, the insulator layer 14 can be formed by a conventional chemical vapor deposition process. It should be understood by those of skill in the art that the thickness of the insulator layer 14 can vary, depending on design and engineering criteria. For example, the thickness of the insulator layer 14 can be about a few microns.

The substrate 12 can be a silicon based material or any other known semiconductor material, for example. In embodiments, the substrate 12 can have an initial thickness, e.g., prior to backside grinding, typically of full wafer thickness such as, in a non-limiting example, of about 700 microns or other dimensions known to those of skill in the art. In other embodiments, the wafer can be thinned to less than the starting thickness of 700 microns. In one example, the wafer is temporarily attached to a glass wafer and thinned to 100 microns. After the wafer backside processing, the glass handle wafer is removed.

Still referring to FIG. 1, a plurality of vias 16 are formed through the frontside of the structure in order to avoid wafer backside TSV reveal and wafer breakage problems. More specifically, the plurality of vias 16 are formed through the insulator layer 14 and partially into the substrate 12. Although three vias 16 are shown, it should be understood that one or more vias are contemplated by the present invention in order to avoid TSV reveal and wafer breakage problems.

In embodiments, the plurality of vias 16 have a width, e.g., diameter, of about 0.5 to 4 microns and spacing of about 9 microns, although other dimensions are also contemplated by the present invention. For example, in embodiments, the plurality of vias 16 can have a minimum spacing. In additional embodiments, the plurality of vias 16 can be formed partially into the substrate, e.g., to about 1% to 25% of the starting thickness of the substrate 12. For example, the plurality of vias 16 can be about 5 to 150 microns deep into the substrate 12 depending on the initial thickness of the substrate; although other dimensions are also contemplated by the present invention. For example, in a scenario in which the substrate 12 is not thinned, the via can be provided at a deeper depth. In another example, the plurality of vias 16 clear the device layer (e.g., insulator 14) and are provided in the substrate 12 to such a depth that still ensures integrity of the device layer and the substrate 12 during and/or after the backside etching process.

The plurality of vias 16 can be formed using conventional lithography, etching and deposition processes or sidewall image transfer (SIT) processes. In one embodiment, for example, a resist can be formed over the insulator material 14, which is exposed to energy (light) in order to form a pattern (opening). A reactive ion etch (RIE) using an appropriate chemistry is performed to form vias into the substrate 12. The RIE can be timed to ensure that the vias are of a certain, required depth into the substrate 12. The resist can be removed by an oxygen ashing process. After optional wafer cleaning steps, the vias are metalized by a deposition of liner and bulk conductor metals, e.g., TiN, tungsten. In embodiments, TiN and tungsten can be deposited using a standard deposition process (e.g., atomic layer deposition (ALD)), plating process, sputtering processes of other conventional CVD processes. In other embodiments, the vias are metalized with a refractory metal liner, such as TaN/TiN, followed by copper formed with a physical vapor deposition (PVD) and electroplated (ECP) step. In these embodiments, excess metal is removed with a chemical mechanical polish (CMP) step.

Figure 2:
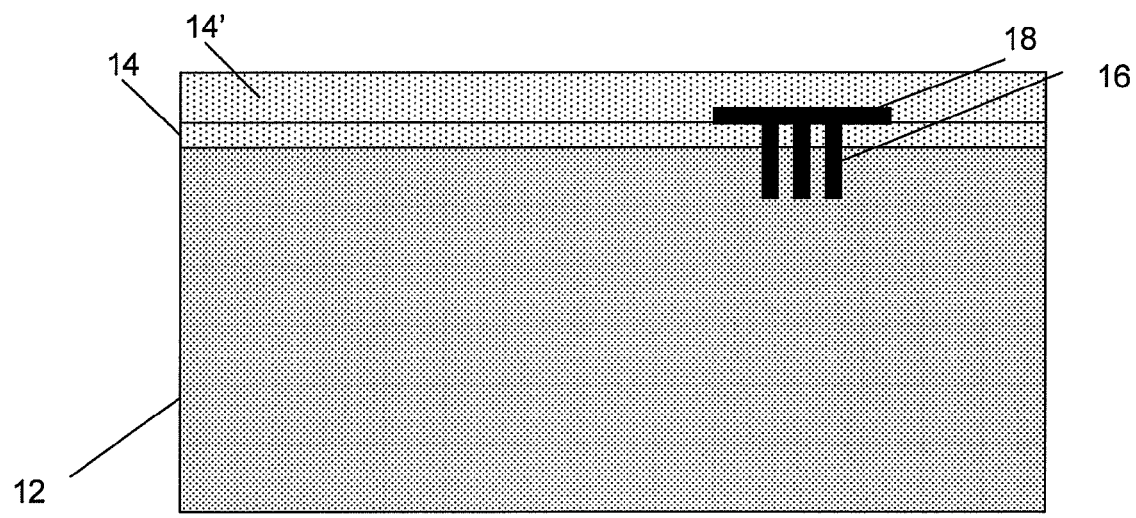

In FIG. 2, a wiring layer 18 is formed in electrical and direct contact with the plurality of vias 16, e.g., metalized vias. The wiring layer 18 can be formed using conventional deposition processes, e.g., CVD, plating or sputtering. In embodiments, the wiring layer 18 can be any metal or metal alloy such as, for example, tungsten, aluminum, or copper with optional refractory metal layers. In additional front end of the line (FEOL) processes, additional insulator layers 14' can be formed over the wiring layer 18 and other passive and active structures, e.g., transistors, diodes, capacitors, switches, etc., can be formed within or on the insulator layers 14, 14'.

Figure 3A:
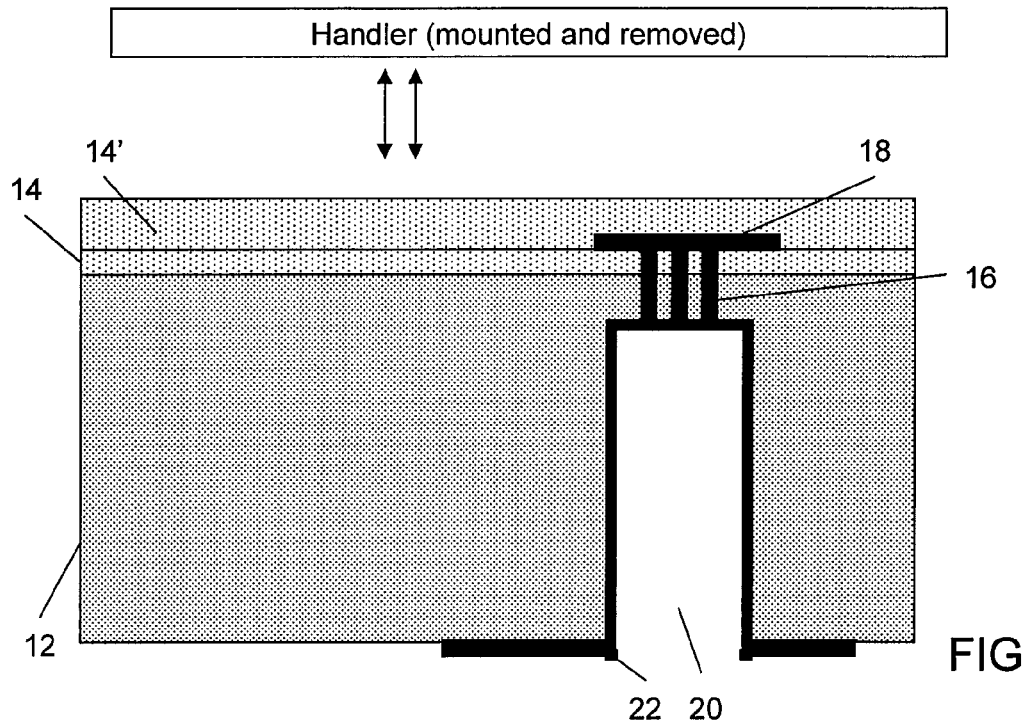

FIG. 3a shows additional fabrication processes performed on a backside of the substrate 12. In these processes, an optional handler such as a glass plate is mounted to the frontside of the structure, e.g., onto the insulator layer 14'. The structure is then flipped to perform a backside grinding processes. After grinding of the backside of the substrate 12, a via 20 is formed from the backside of the thinned substrate 12 using conventional RIE processes. In embodiments, the via 20 is etched to a depth which exposes the plurality of vias 16, from the backside of the substrate 12. For example, the via 20 can be etched to about 80% of the depth of the thinned substrate 12, e.g., 50 to 60 microns. In embodiments, the via 20 can be about 30 microns in diameter; although other dimensions are also contemplated by the present invention depending on the spacing, sizing and number of vias 16 formed from the frontside of the structure.

Still referring to FIG. 3a, the via 20 can be metalized by any method including a combination of PVD and/or ECD with a metal or metal alloy (e.g., conductor) 22. The via 20 can also be completely filled with a metal or metal alloy (e.g., conductor), also represented by reference numeral 22. By way of non-limiting illustrative example, a metal or metal alloy (e.g., conductor) 22 can be formed on sidewalls of the via 20, extending to the underside of the substrate 12. In embodiments, the metal or metal alloy 22 can be a refractory metal, copper, and gold film stack in direct electrical contact with the plurality of vias 16; although other metals are also contemplated by the present invention. For example, the metal can be chrome or titanium followed by copper and/or gold film stack.

In embodiments, the metal or metal alloy 22 can be formed by a sputter PVD or plating ECP process, as is well known to those of skill in the art. In embodiments, these wafer backside vias are metalized such that all of the wafer frontside vias are shorted to ground through the wafer backside metal.

Figure 3B:
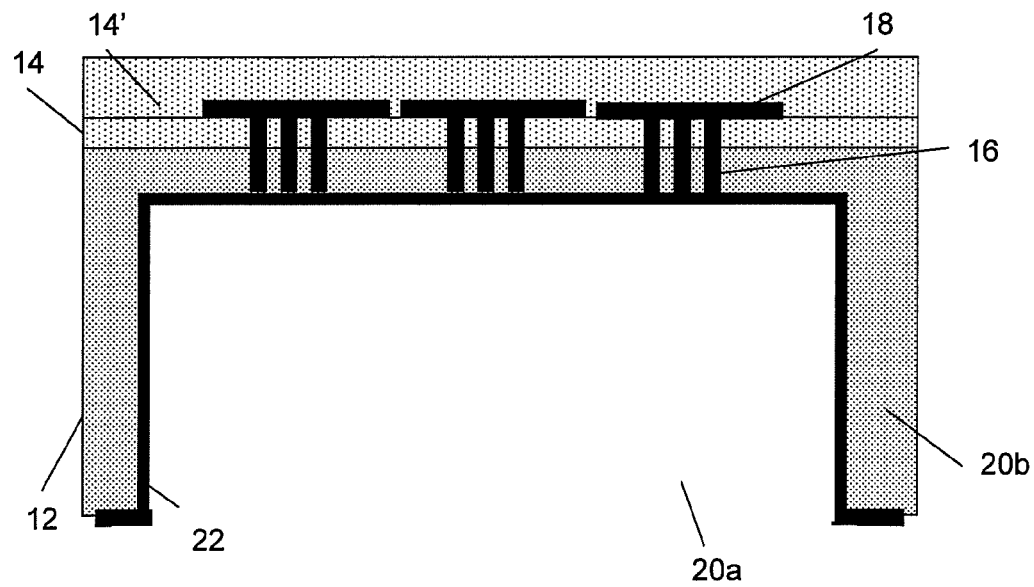

As shown in FIG. 3b, in alternative embodiments, the via 20a can be, for example, the size of an interior of the chip, e.g., about 90% of the chip area, leaving a rim 20b (e.g., about 20%) about the chip for chip handling. In this embodiment, as shown in FIG. 3b, a configuration of several clusters of vias 16 can be provided, with a single via 20a on the underside exposing all of the vias 16. As in FIG. 3a, a metal or metal alloy 22 can be formed on sidewalls of the via 20a, extending to the underside of the substrate 12 about the rim 20b. In embodiments, the metal or metal alloy 22 can be a copper and gold film stack in direct electrical contact with the plurality of metalized vias 16; although other metals are also contemplated by the present invention. In embodiments, the metal or metal alloy 22 can be formed by a sputter or plating process, as is well known to those of skill in the art.

Figure 4:
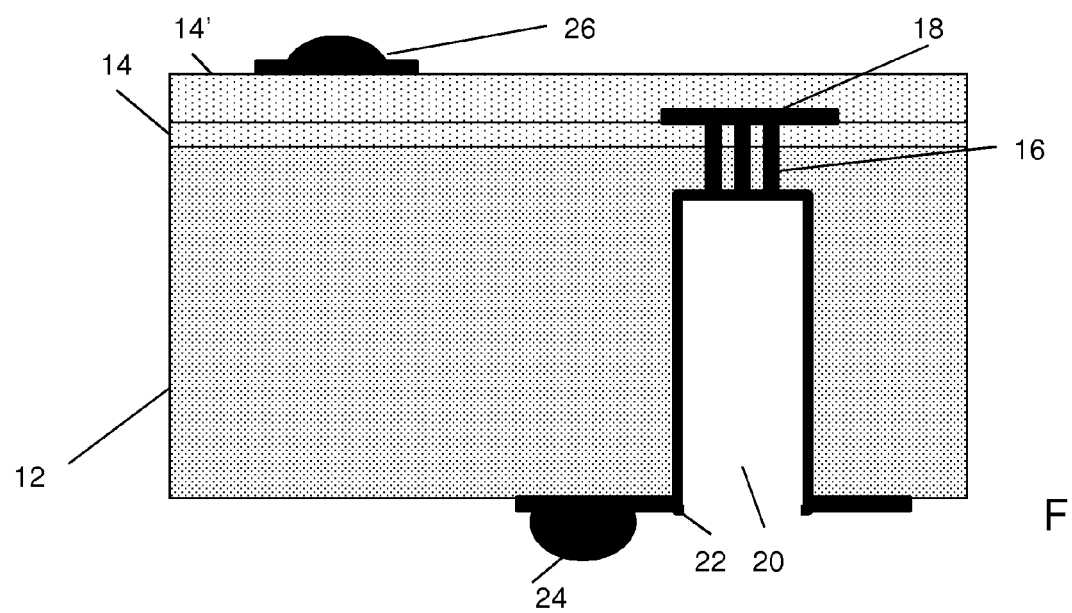

In FIG. 4, bonding pads and connections, e.g., solder bumps, are formed on the frontside and backside of the structure. For example, controlled collapsed connection (C4) solder bumps 24 are formed on the metal or metal alloy 22, on the underside of the substrate 12. Similarly, controlled collapsed connection (C4) solder bumps 26 are formed on bond pads, on the topside of the substrate 12, e.g., on the insulator layer 14'. In embodiments, the controlled collapsed (C4) solder bumps (and bonding pads) 24, 26 provide connections to an outside package or laminate. It should also be understood that the metal alloy 22 on the underside of the structure can also be considered a patterned or blanket deposited electronic layer, which can be suitable for forming other circuitry, e.g., resistors, etc.

Figure 5:
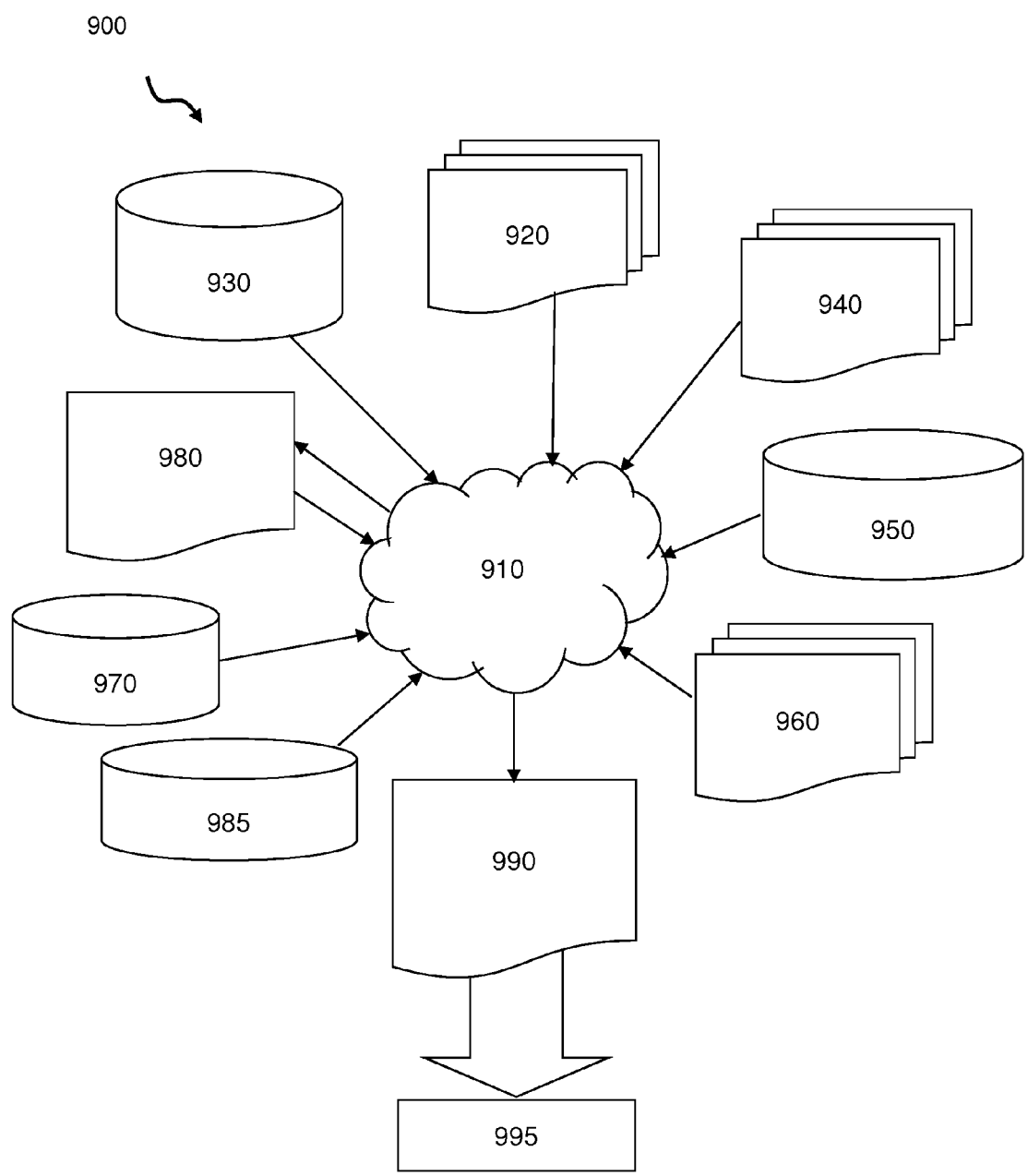
FIG. 5 is a flow diagram of a design process used in semiconductor design, manufacture, and/or test.

FIG. 5 is a flow diagram of a design process used in semiconductor design, manufacture, and/or test. FIG. 5 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-4. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 5 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-4. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-4 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-4. In one embodiment, design structure 990 may comprise a compiled, executable HDL simulation model that functionally simulates the devices shown in FIGS. 1-4.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-4. Design structure 990 may then proceed to a stage 995 where, for example, design structure 990: proceeds to tape-out, is released to manufacturing, is released to a mask house, is sent to another design house, is sent back to the customer, etc.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method, comprising:
   forming a plurality of frontside metalized vias into a partial depth of a substrate;
   mounting a frontside of the substrate to a glass handle wafer;
   forming a backside via in the substrate which exposes, from the backside, the plurality of frontside metalized vias;
   forming a metal in the backside via in contact with the plurality of metalized frontside vias;
   removing the glass handle wafer from the frontside of the substrate; and
   forming solder bumps on the frontside and backside of the substrate, wherein the solder bumps on the backside of the substrate are in direct contact with the metal.

2. The method of claim 1, wherein the plurality of frontside metalized vias are one or more vias.

3. The method of claim 1, wherein the plurality of frontside metalized vias are formed about 1% to 25% into the depth of the substrate.

4. The method of claim 1, further comprising forming a wiring layer in contact with the plurality of frontside metalized vias.

5. The method of claim 1, wherein the plurality of frontside metalized vias have a minimum spacing between the plurality of frontside metalized vias.

6. The method of claim 1, further comprising mounting a handler to a frontside of the substrate and grinding a backside of the substrate, prior to the forming the backside via.

7. The method of claim 6, wherein the forming the metal in the via comprises depositing a conductor on the backside via, which extends to an underside of the substrate.

8. The method of claim 7, wherein the conductor is a titanium or chrome followed by copper and/or gold film stack.

9. The method of claim 6, wherein the forming the metal in the backside via comprises filling the backside via with a metal or metal alloy, which extends to an underside of the substrate.

10. A method, comprising:
    forming a plurality of vias partially into a substrate, from a frontside;
    filling the plurality of vias with a metal;
    mounting the substrate, from the frontside, on a glass handler wafer;
    grinding a backside of the substrate;
    forming a via into the substrate, from the backside of the substrate, to expose the plurality of vias;
    metalizing the via to be in direct electrical contact with the plurality of vias;
    removing the glass handler wafer from the substrate; and
    forming solder bumps on the frontside and backside of the substrate, wherein the solder bumps on the backside of the substrate are in direct contact with the metalizing.

11. The method of claim 10, wherein the metalizing of the via comprises depositing a conductor in the via in direct electrical contact with the plurality of vias.

12. The method of claim, 11 wherein the depositing includes forming metal on an underside of the substrate.

13. The method of claim 12, wherein the metal is a chrome or titanium followed by copper and/or gold film stack.

14. The method of claim 10, wherein the metalizing of the via comprises filling the via with a metal or metal alloy, which extends to an underside of the substrate.

15. The method of claim 10, wherein the plurality of vias are two or more vias, with a minimal spacing between the plurality of vias.

16. The method of claim 10, wherein the plurality of vias extend partially into the substrate to a depth of about 1% to 25%.

17. The method of claim 16, wherein the plurality of vias extend through an insulator material on a top of the substrate.

18. A structure, comprising:
    a substrate;
    a plurality of frontside metalized vias partially in a depth of the substrate and extending completely through an insulator layer provided on a frontside surface of the substrate;
    a plurality of frontside wirings formed in direct electrical contact with the frontside metalized vias and which is embedded with a dielectric layer;

a backside via partially in a depth of a backside of the substrate and which exposes the plurality of frontside metalized vias from the backside of the substrate;

a metalized layer on the backside via in the substrate and extending onto a bottom surface of the substrate, in direct electrical contact with the plurality of vias; and solder bumps on the frontside surface and backside surface of the structure, wherein the solder bumps on the backside surface of the substrate are in direct contact with the metalized layer.

19. The structure of claim 18, wherein the metalized layer on the backside comprises chrome followed by gold film stack.

20. The structure of claim 18, wherein the plurality of frontside metalized vias extend through an insulator material on a top of the substrate.

* * * * *